(12) United States Patent
Hu et al.

(10) Patent No.: US 8,883,574 B2
(45) Date of Patent: Nov. 11, 2014

(54) TRANSISTOR WITH ETCHING STOP LAYER AND MANUFACTURING METHOD THEREOF

(71) Applicant: AU Optronics Corporation, Hsin-Chu (TW)

(72) Inventors: Chin-Wei Hu, Hsin-Chu (TW); Ching-Sang Chuang, Hsin-Chu (TW); Chia-Yu Chen, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 138 days.

(21) Appl. No.: 13/794,423

(22) Filed: Mar. 11, 2013

(65) Prior Publication Data
US 2013/0196475 A1    Aug. 1, 2013

Related U.S. Application Data

(62) Division of application No. 13/006,580, filed on Jan. 14, 2011, now Pat. No. 8,415,672.

(30) Foreign Application Priority Data

Aug. 30, 2010  (TW) ................. 99129110 A (51) Int. Cl.
*H01L 29/66* (2006.01)
*H01L 29/786* (2006.01)

(52) U.S. Cl.
CPC .... *H01L 29/66757* (2013.01); *H01L 29/78606* (2013.01)
USPC ............................ 438/151; 438/158; 438/166

(58) Field of Classification Search
USPC .......................................... 438/151, 158, 166
See application file for complete search history.

(56) References Cited

U.S. PATENT DOCUMENTS

| 7,247,529 B2 | 7/2007 | Shoji et al. |
| 7,800,113 B2 | 9/2010 | Shoji et al. |
| 2006/0008931 A1 | 1/2006 | Lee et al. |

FOREIGN PATENT DOCUMENTS

| CN | 1767159 | 5/2006 |
| CN | 101562198 | 10/2009 |
| CN | 101572274 | 11/2009 |
| CN | 101582453 A | 11/2009 |
| CN | 100570834 C | 12/2009 |
| CN | 101728436 | 6/2010 |
| JP | 3003372 | 1/1991 |
| TW | 200712599 | 4/2007 |

OTHER PUBLICATIONS

English language translation of abstract and pertinent parts of CN 100570834 (published Dec. 16, 2009).
English language translation of abstract and pertinent parts of CN 101582453 (published Nov. 18, 2009).
English language translation of abstract of JP 3003372 (published Jan. 9, 1991).

(Continued)

*Primary Examiner* — Long Pham
(74) *Attorney, Agent, or Firm* — McClure, Qualey & Rodack, LLP (57) ABSTRACT

This invention provides a transistor with an etching stop layer and a manufacturing method thereof. The transistor structure includes a substrate, a crystalline semiconductor layer, an etching stop structure, an ohmic contact layer, a source, a drain, a gate insulating layer, and a gate. The manufacturing method is performed by patterning the ohmic contact layer and the crystalline semiconductor layer at the same time with the same mask; and patterning the ohmic contact layer and the source/drain layer at the same time with another the same mask.

9 Claims, 10 Drawing Sheets

(56) References Cited

OTHER PUBLICATIONS

English language translation of abstract of TW 200712599 (published Apr. 1, 2007).
English language translation of abstract of CN 101562198 (published Oct. 21, 2009).
English language translation of abstract of CN 101572274 (published Nov. 4, 2009).
English language translation of abstract of CN 101728436 (published Jun. 9, 2010).
English language translation of abstract of CN 1767159 A (published May 3, 2006).

TRANSISTOR WITH ETCHING STOP LAYER AND MANUFACTURING METHOD THEREOF

RELATED APPLICATIONS

This application is a divisional application of U.S. application Ser. No. 13/006,580, filed Jan. 14, 2011 which was based on, and claims priority from, Taiwan Patent Application Serial Number 099129110, filed Aug. 30, 2010, the entire contents of which are hereby incorporated by reference.

BACKGROUND

1. Field of Invention

The present invention relates to a transistor. More particularly, the present invention relates to a thin film transistor with an etching stop structure.

2. Description of Related Art

Currently, a top gate structure (device) of a conventional thin film transistor has been widely applied in a flat display apparatus. Herein, the top gate is directed to a gate disposed above a semiconductor stack layer which includes a polycrystalline silicon layer and an ohmic contact layer, i.e., a polycrystalline silicon layer is first formed and then an ohmic contact layer is formed above the polycrystalline silicon layer, and the ohmic contact layer has an N+ region or a P+ region therein. However, in a general process of manufacturing a general top gate transistor device, when the ohmic contact layer is etched, i.e., when the N+ region and P+ region are etched, the polycrystalline silicon layer right below and around the gate is liable to be etched, and thus a front path of the polycrystalline silicon layer (also referred to as an active layer) is damaged, that is to say, the polycrystalline silicon layer below the gate is etched to be thinner than the originally-designed thickness. When the polycrystalline silicon layer (also referred to as the active layer) of the transistor is thinner, it is more difficult to control the thickness uniformity of the polycrystalline silicon layer (also referred to as the active layer) in the etching process, thus causing the electrical property to be not uniform. Moreover, the damage of the front path will result in the decrease of the electron mobility, the increase of the current leakage and the deterioration of the subcritical effect, so that the reliability of the transistor device is not good and the top gate structure (device) of the thin film transistor is limited in its applications.

Therefore, the conventional structure of the top gate transistor device needs improvements.

SUMMARY

In view of the above, a main aspect of the present invention is to provide a transistor, which at least includes a substrate, a crystalline semiconductor layer, an etching stop structure, an ohmic contact layer, a source, a drain, a gate insulating layer and a gate. The crystalline semiconductor layer is disposed on the substrate, wherein the crystalline semiconductor layer includes an upper surface, a first side surface and a second side surface. The etching stop structure is disposed on the crystalline semiconductor layer, and the etching stop structure includes a first portion and a second portion. The ohmic contact layer is disposed on the crystalline semiconductor layer and the etching stop structure, and includes a first ohmic contact region and a second ohmic contact region, wherein the first ohmic contact region extends towards the crystalline semiconductor layer from an area above the first portion of the etching stop structure and overlies one side of the upper surface of the crystalline semiconductor layer, and the second ohmic contact region extends towards the crystalline semiconductor layer from an area above the second portion of the etching stop structure and overlies the other side of the upper surface of the crystalline semiconductor layer. The source overlies the first ohmic contact region, and the drain overlies the second ohmic contact region. The gate insulating layer is disposed on the source, the drain and the crystalline semiconductor layer. The gate is disposed on the gate insulating layer and is corresponding to the crystalline semiconductor layer.

Furthermore, in the transistor of the present invention, a buffer layer may further be selectively formed on the substrate and then a crystalline semiconductor layer may be formed. The crystalline semiconductor layer is, for example, a polycrystalline silicon semiconductor layer, but the material of the crystalline semiconductor layer is not limited to Si, and may be other semiconductor materials for example, IGZO, IGO, IZO, or other proper materials or combinations thereof, and its crystalline form is also not limited to polycrystalline and may be other crystalline forms, for example microcrystalline.

Another aspect of the present invention is to provide a manufacturing method of a transistor, which includes: providing a substrate; forming a patterned crystalline semiconductor layer on the substrate; forming a patterned etching stop structure on the crystalline semiconductor layer; depositing an ohmic contact layer to overlie the crystalline semiconductor layer and etching stop structure; respectively forming the first ohmic contact region on one side of the crystalline semiconductor layer and the etching stop structure, and a second ohmic contact region on the other side of the crystalline semiconductor layer and the etching stop structure; and respectively forming a source to overlie the first ohmic contact region and the substrate, and a drain to overlie the second ohmic contact region and the substrate.

Furthermore, according to the manufacturing method of the present invention, the ohmic contact layer and the crystalline semiconductor layer may be patterned by using one identical mask (or namely the same mask) at the same time, or the ohmic contact layer and the source/drain layer may be patterned by using another identical mask (or namely another the same mask) at the same time.

BRIEF DESCRIPTION OF THE DRAWINGS

The invention can be more fully understood by reading the following detailed description of the embodiment, with reference made to the accompanying drawings as follows.

DETAILED DESCRIPTION

The present invention relates to a transistor with an etching stop structure. Hereinafter, preferred embodiments of the present invention are illustrated in accompanying with the drawings, and the technical features of the present invention are described in details.

Figure 1:
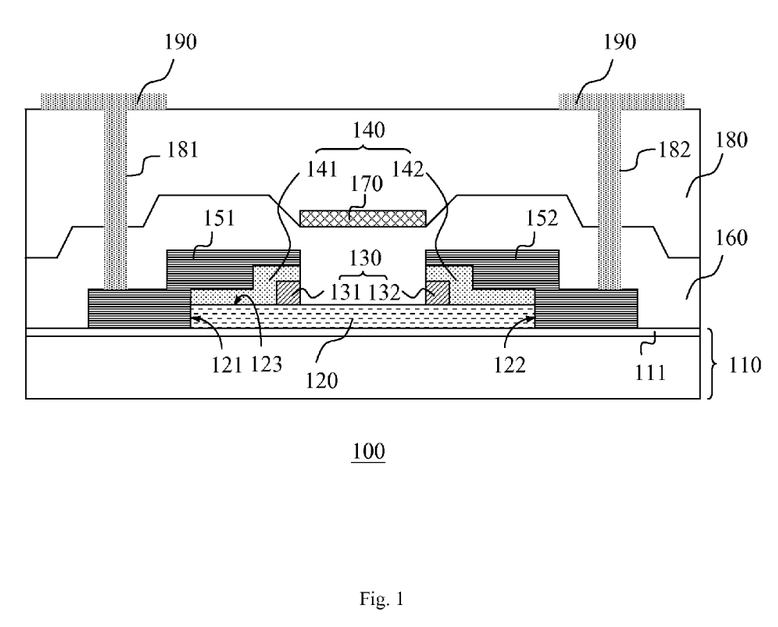
FIG. 1 is a schematic structural view showing an instance of a transistor of the present invention.

Referring to FIG. 1, FIG. 1 is a schematic structural view of an instance of a transistor of the present invention. A transistor 100 of the present invention includes a substrate 110, a crystalline semiconductor layer 120, an etching stop structure (or namely etching stop layer) 130, an ohmic contact layer 140, a source 151, a drain 152, a gate insulating layer 160 and a gate 170. A crystalline semiconductor layer (is also referred to as an intrinsic layer, active layer, or channel layer) 120 is disposed on the substrate 110, and the crystalline semiconductor layer 120 has a first side surface 121, a second side surface 122 and an upper surface 123, wherein the upper surface 123 opposites with inner surface of the substrate 110. The etching stop structure 130 is disposed on the crystalline semiconductor layer 120, and the etching stop structure 130 includes a first portion 131 and a second portion 132. The ohmic contact layer 140 is disposed on the crystalline semiconductor layer 120 and the etching stop structure 130, and includes a first ohmic contact region 141 and a second ohmic contact region 142, wherein the first ohmic contact region 141 extends towards the crystalline semiconductor layer 120 from an area above the first portion 131 of the etching stop structure 130 and overlies one side of the upper surface 123 of the crystalline semiconductor layer 120, and the second ohmic contact region 142 extends towards the crystalline semiconductor layer 120 from an area above the second portion 132 of the etching stop structure 130 and overlies the other side of the upper surface 123 of the crystalline semiconductor layer 120. The source 151 overlies the first ohmic contact region 141, and an edge of the source 151 is substantially aligned with an edge of the first ohmic contact region 141 and is substantially aligned with an edge of the first portion 131 of the etching stop structure 130. The drain 152 overlies the second ohmic contact region 142, and an edge of the drain 152 is substantially aligned with an edge of the second ohmic contact region 142 and is substantially aligned with an edge of the second portion 132 of the etching stop structure 130. The gate insulating layer 160 is disposed on the source 151, the drain 152 and the crystalline semiconductor layer 120. Preferred, the gate 170 is corresponding to the position of the crystalline semiconductor layer 120, and is disposed on the gate insulating layer 160.

Furthermore, in the transistor 100 of the present invention, a buffer layer 111 may further be selectively formed on the substrate 110 and then the crystalline semiconductor layer 120 may be formed. The crystalline semiconductor layer 120 is, for example, a polycrystalline silicon semiconductor layer, but the material of the crystalline semiconductor layer 120 is not limited to Si, and may be other semiconductor materials, for example IGZO, IGO, IZO, or other proper materials or combinations thereof, and the crystalline form is not limited to polycrystalline and may be other crystalline forms, e.g., microcrystalline.

In addition to the components described above, the transistor 100 further includes a protective layer 180, a first through hole 181, a second through hole 182 and a conductive layer 190. The protective layer 180 overlies the gate 170 and the gate insulating layer 160. The first through hole 181 penetrates through the protective layer 180 and the gate insulating layer 160 and exposes the source 151. The second through hole 182 penetrates through the protective layer 180 and the gate insulating layer 160 and exposes the drain 152. The conductive layer 190 is disposed on the protective layer 180, and the conductive layer 190 is connected to the source 151 and the drain 152 respectively through the first through hole 181 and the second through hole 182.

Figure 2A:
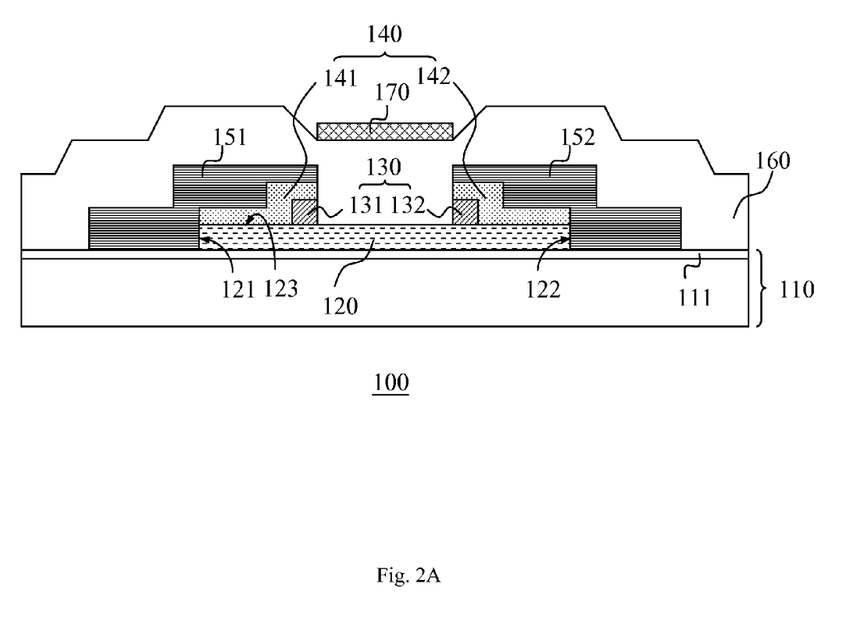
FIGS. 2A and 2B are schematic views showing main feature structure of a transistor according to first and second embodiments of the present invention.
Figure 2B:
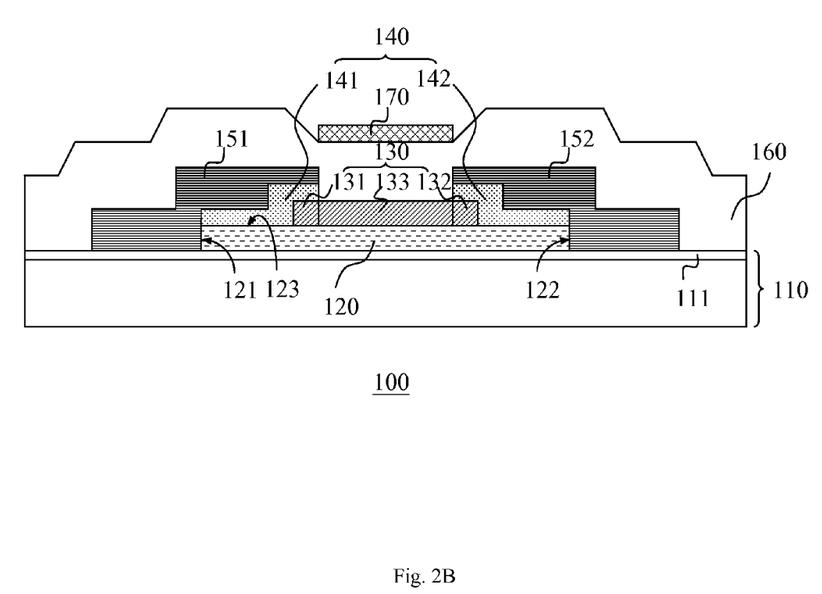

Then, Referring to FIG. 2A, and FIG. 2B, FIGS. 2A and 2B are schematic views showing main feature structure of a transistor according to first and second embodiments of the present invention. In the first embodiment as shown in FIG. 2A, the first portion 131 of the etching stop structure 130 is sandwiched between an area right below the first ohmic contact region 141 and the crystalline semiconductor layer 120, and the second portion 132 of the etching stop structure 130 is sandwiched between an area right below the second ohmic contact region 142 and the crystalline semiconductor layer 120, and the first portion 131 and the second portion 132 of the etching stop structure 130 do not contact each other. Therefore, the etching stop structure 130 of the transistor 100 in FIG. 1 may expose a portion of the crystalline semiconductor layer 120.

Additionally, in the second embodiment shown in FIG. 2B, in addition to the first portion 131 sandwiched between an area right below the first ohmic contact region 141 and the crystalline semiconductor layer 120 and the second portion 131 sandwiched between an area right below the second ohmic contact region 142 and the crystalline semiconductor layer 120, the etching stop structure 130 may further include a third portion 133. The third portion 133, the first portion 131 and second portion 132 are connected to form an integral etching stop structure 130. Therefore, the etching stop structure 130 of the transistor 100 in FIG. 1B completely overlies the crystalline semiconductor layer 120. The etching stop structure 130, the first ohmic contact region 141 and second ohmic contact region 142 completely covers the crystalline semiconductor layer 120. Furthermore, the transistor 100 of the present invention further includes the features that a buffer layer 111 is first selectively formed on the substrate 110 and then the crystalline semiconductor layer 120 is formed.

Figure 3A:
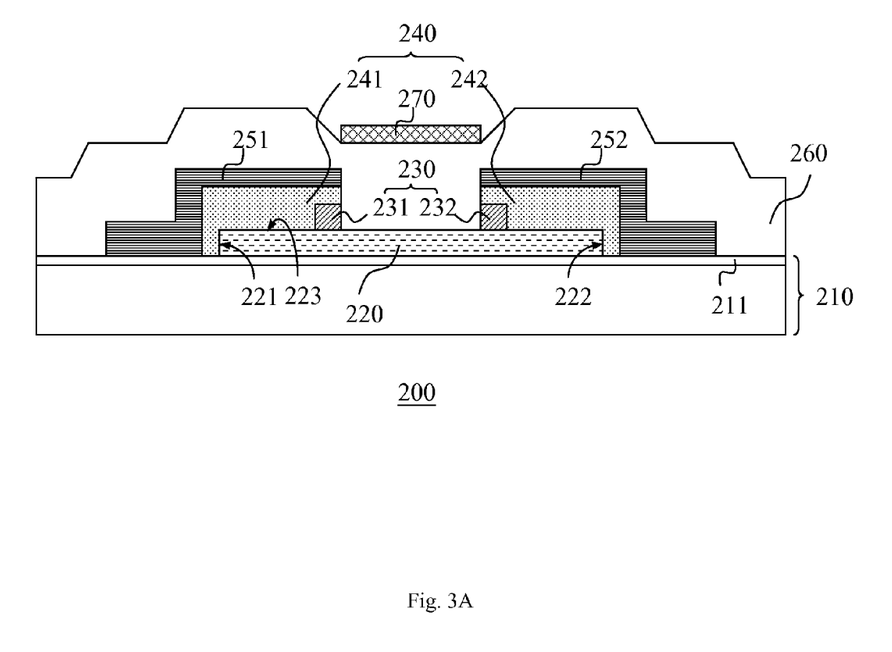
FIGS. 3A and 3B are schematic views showing main feature structure of a transistor according to third and fourth embodiments of the present invention.
Figure 3B:
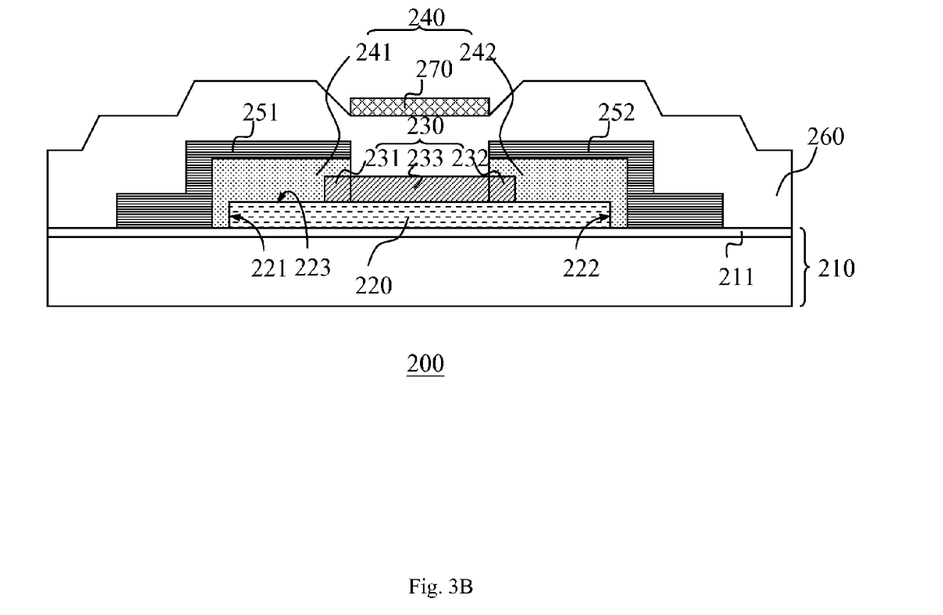

Then, Referring FIGS. 3A and 3B, FIGS. 3A and 3B are schematic views showing main feature structure of a transistor according to third and fourth embodiments of the present invention. The constitution of a transistor 200 in FIGS. 3A and 3B is substantially similar to that of the transistor 100 in FIGS. 2A and 2B. The structures are somewhat different due to different etching sequences in the processes. In the below, the description of the same components of in two transistors will be omitted.

Referring to FIGS. 3A and 3B and FIGS. 2A and 2B together, the transistor 200 differs from the transistor 100 in that, in addition to overlying one side of an upper surface 223 of a crystalline semiconductor layer 220, a first ohmic contact region 241 of an ohmic contact layer 240 of the transistor 200 further extends to cover a first side surface 221 of the crystalline semiconductor layer 220 and a portion of the substrate 210; and in addition to overlying the other side of the upper surface 223 of the crystalline semiconductor layer 220, a second ohmic contact region 242 of the ohmic contact layer 240 further extends to cover a second side surface 222 of the crystalline semiconductor layer 220 and a portion of substrate 210.

In the third embodiment shown in FIG. 3A, a first portion 231 of an etching stop structure 230 is sandwiched between an area right below the first ohmic contact region 241 and the crystalline semiconductor layer 220, and a second portion 232 of the etching stop structure 230 is sandwiched between an area right below the second ohmic contact region 242 and the crystalline semiconductor layer 220, and the first portion 231 and the second portion 232 of the etching stop structure 230 do not contact each other. Therefore, the etching stop structure 230 of the transistor 200 in FIG. 2A may expose a portion of the crystalline semiconductor layer 220.

Additionally, in the fourth embodiment shown in FIG. 3B, in addition to the first portion 231 sandwiched between an area right below the first ohmic contact region 241 and the crystalline semiconductor layer 220 and the second portion 231 sandwiched between an area right below the second ohmic contact region 242 and the crystalline semiconductor layer 220, the etching stop structure 230 may further include a third portion 233. The third portion 233, the first portion 231 and second portion 232 are connected to form an integral etching stop structure 230. Therefore, the etching stop structure 230 of the transistor 200 in FIG. 2B completely covers the crystalline semiconductor layer 220. The etching stop structure 230 and the first ohmic contact region 241 and second ohmic contact region 242 completely covers the crystalline semiconductor layer 220. Furthermore, the transistor 200 of the present invention further includes the feature that a buffer layer 211 is first selectively formed on the substrate 210 and then the crystalline semiconductor layer 220 is formed.

Figure 4A:
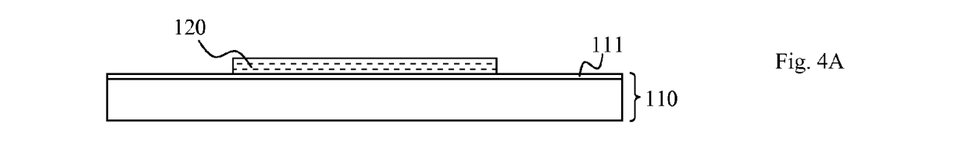
FIGS. 4A-4J are schematic views showing a process for manufacturing a transistor according to the present invention.
Figure 4B:
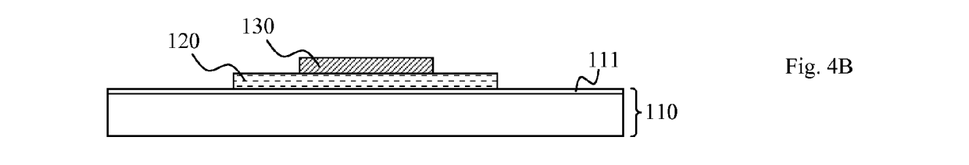
Figure 4C:
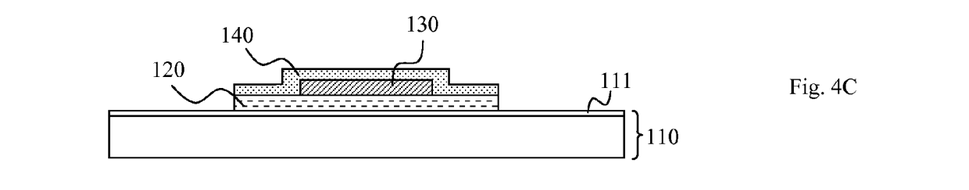
Figure 4D:
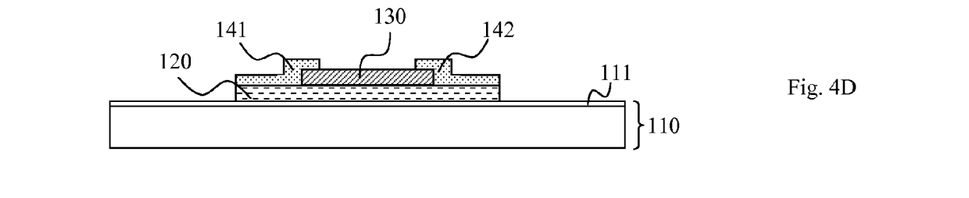

Hereinafter, a manufacturing method of a transistor of the present invention is illustrated. FIGS. 4A-4J are schematic views showing a fabricating process of a transistor according to the present invention. For the sake of simplicity, only the transistor 100 in the first and second embodiments of the present invention is used as an example, but the present invention is not limited thereto. According to the manufacturing method of the present invention, firstly, a patterned crystalline semiconductor layer 120 is formed on the substrate 110 (as shown in FIG. 4A), wherein the substrate 110 may include a buffer layer 111. Then, a patterned etching stop structure 130 is formed on the crystalline semiconductor layer 120 (as shown in FIG. 4B). Thereafter, an ohmic contact layer 140 is deposited to overlie the crystalline semiconductor layer 120 and the etching stop structure 130 (as shown in FIG. 4C). Thereafter, a portion of the ohmic contact layer 140 is removed via etching to respectively form a first ohmic contact region 141 on one side of the crystalline semiconductor layer 120 and the etching stop structure 130 and a second ohmic contact region 142 on the other side of the crystalline semiconductor layer 120 and the etching stop structure 130 (as shown in FIG. 4D). Then, a source 151 overlying the first ohmic contact region 141 and the substrate 110 and a drain 152 overlying the second ohmic contact region 142 and the substrate 110 are respectively formed (as shown in FIG. 4G). Thereafter, a gate insulating layer 160 is formed on the source 151, the drain 152 and the crystalline semiconductor layer 120 (as shown in FIG. 4H). Then, a gate 170 is formed on the gate insulating layer 160 (as shown in FIG. 4I). Then, a protective layer 180 is formed to overlie the gate insulating layer 160, and a conductive layer 190 is formed and connected to the source 151 and the drain 152 respectively through the first through hole 181 and the second through hole 182 (as shown in FIG. 4J).

Figure 4E:
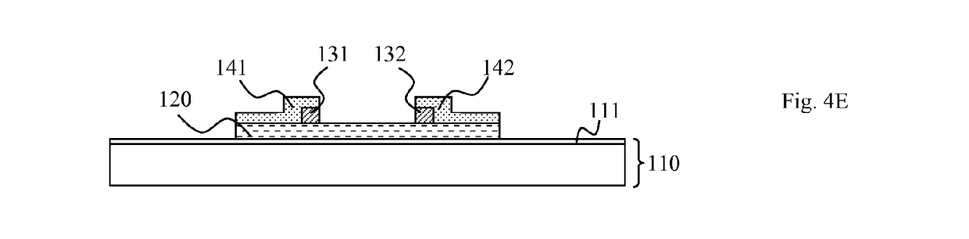

Furthermore, the step of etching the structure of FIG. 4C to respectively form a first ohmic contact region 141 and a second ohmic contact region 142 may further include: removing the etching stop layer exposed outside the first ohmic contact region 141 and the second ohmic contact region 142 to form the structure as shown in FIG. 4E, which exposes a portion of the crystalline semiconductor layer 120. In this manner, the transistor 100 with an exposed portion of the crystalline semiconductor layer 120 according to the first embodiment of FIG. 2A is fabricated. The method of etching the ohmic contact layer 140 and the crystalline semiconductor layer 120 includes, for example, but not limited to, patterning the ohmic contact layer 140 and the crystalline semiconductor layer 120 at the same time through a lithography etching process with an identical mask (or namely the same mask, not shown), so that the transistor 100 as shown in FIGS. 2A and 2B may be formed, wherein an outer edge of the first ohmic contact region 141 is aligned with the first side surface 121 of the crystalline semiconductor layer 120 and an outer edge of the second ohmic contact region 142 on the other side is aligned with the second side surface 122 of the crystalline semiconductor layer 120.

Figure 4F:
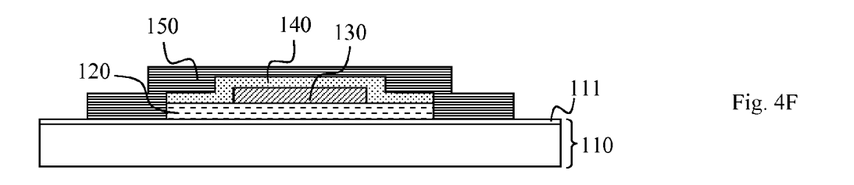
Figure 4G:
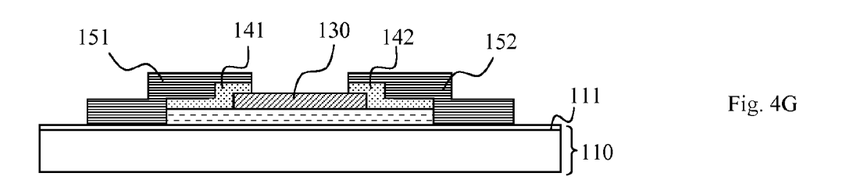
Figure 4H:
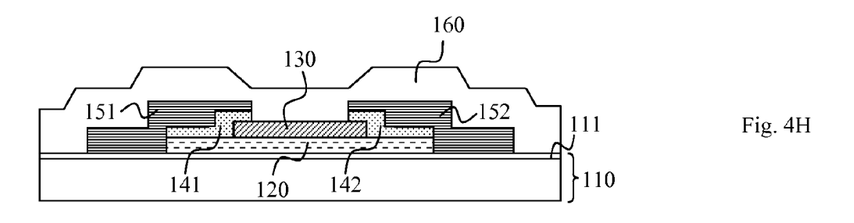
Figure 4I:
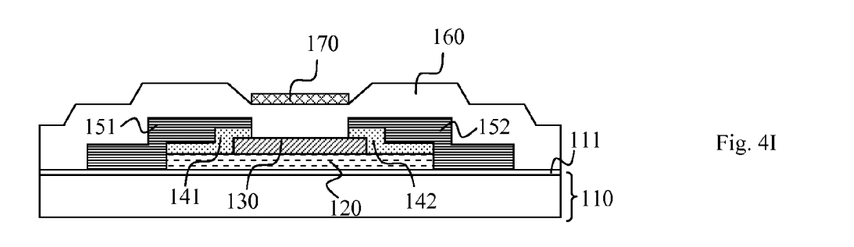
Figure 4J:
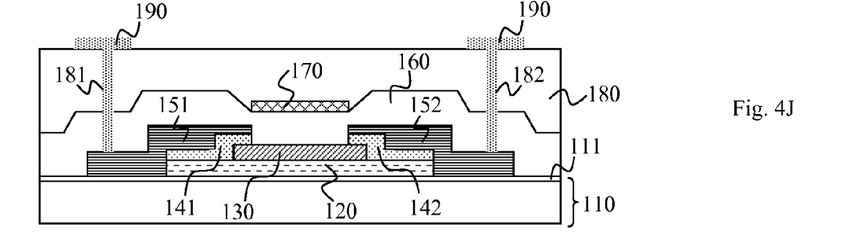

Furthermore, when the electrode is being formed, in order to respectively form the source 151 and the drain 152, the source/drain layer 150 overlying the ohmic contact layer 140 and the substrate 110 may be firstly formed on the structure of FIG. 4C (as shown in FIG. 4F). Through the lithography etching process with another identical mask (or namely another the same mask, not shown), the source/drain layer 150 and the ohmic contact layer 140 are patterned at the same time to form the source 151 and the drain 152 as shown in FIG. 4G. An inner edge of the source 151 is substantially aligned with an edge of the first ohmic contact region 141, and an inner edge of the drain 152 is substantially aligned with an edge of the second ohmic contact region 142.

Figure 5A:
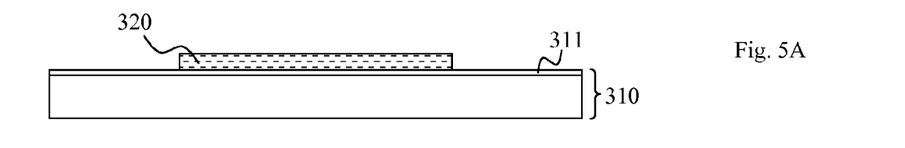
FIGS. 5A-5G are schematic views showing another process for manufacturing a transistor according the present invention.
Figure 5B:
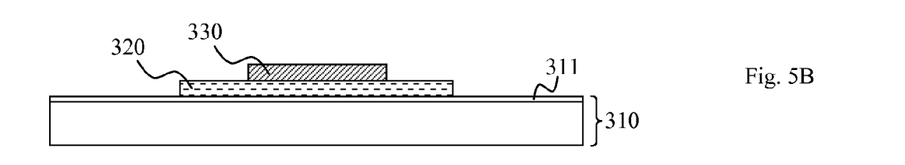
Figure 5C:
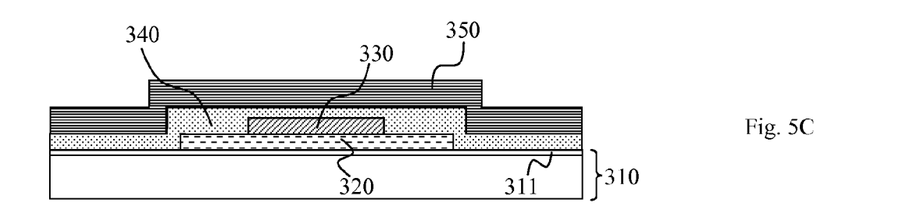
Figure 5D:
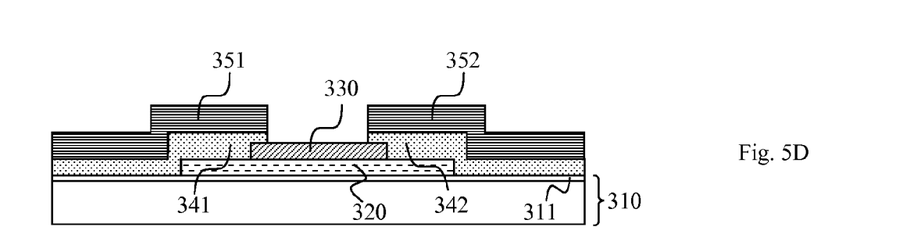
Figure 5E:
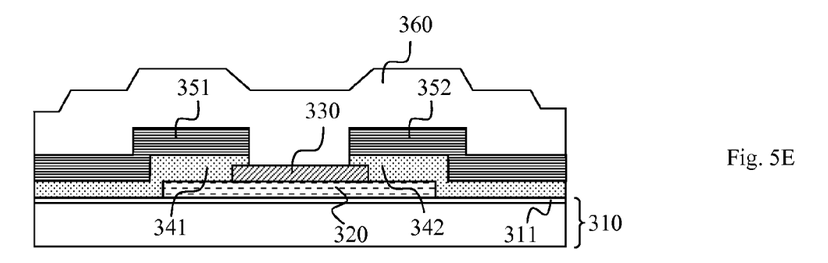
Figure 5F:
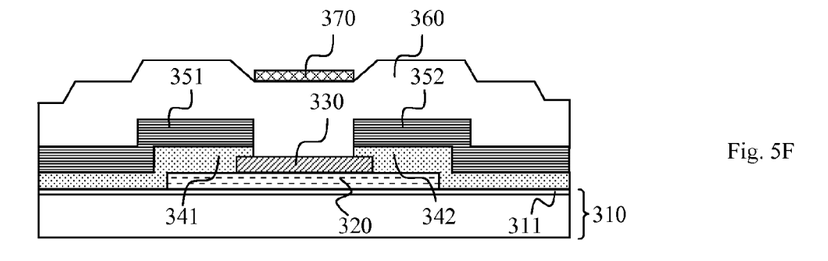
Figure 5G:
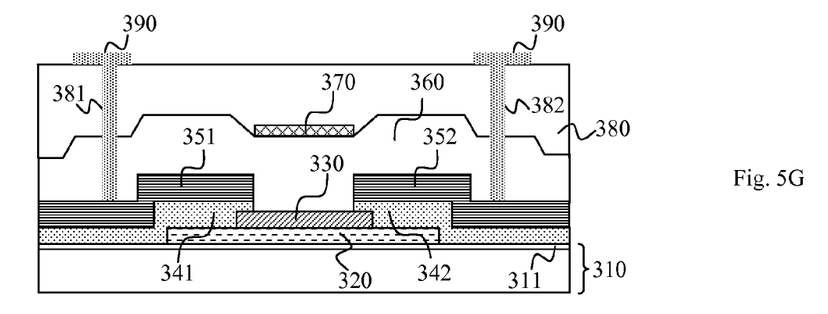

Additionally, the present invention may adopt another method to form the first ohmic contact region, the second ohmic contact region, the source and the drain. Referring to FIGS. 5A-5G, a patterned crystalline semiconductor layer 320 is formed on a substrate 310 (as shown in FIG. 5A), wherein the substrate 310 may include a buffer layer 311. Then, a patterned etching stop structure 330 is formed on a crystalline semiconductor layer 320 (as shown in FIG. 5B). Thereafter, an ohmic contact layer 340 and a source/drain layer 350 are successively deposited, wherein the ohmic contact layer 340 overlies the substrate 310, the crystalline semiconductor layer 320 and the etching stop structure 330, and the source/drain layer 350 overlies the ohmic contact layer 340 (as shown in FIG. 5C). Then, through the lithography etching process with an identical mask (or namely the same mask, not shown), the source/drain layer 350 and the ohmic contact layer 340 are patterned at the same time to form a first ohmic contact region 341 and a source 351 overlaid thereon, and the second ohmic contact region 342 and the drain 352 overlaid thereon (as shown in FIG. 5D). Thereafter, a gate insulating layer 360 is formed to overlie the source 351 and the drain 352 (as shown in FIG. 5E). Then, a gate 370 is formed on the gate insulating layer 360 (as shown in FIG. 5F). Then, a protective layer 380 is formed to overlie the gate insulating layer 360, and a conductive layer 390 is formed and connected to the source 351 and the drain 352 respectively through the first through hole 381 and the second through hole 382 (as shown in FIG. 5G).

Figure 6A:
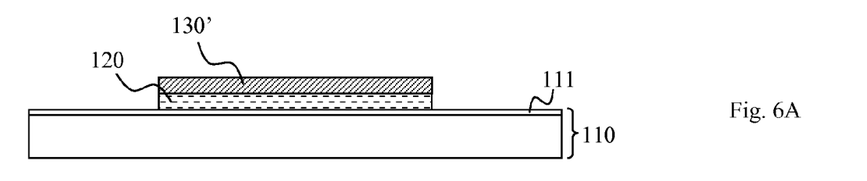
FIGS. 6A-6D are schematic views showing a process for forming a patterned etching stop structure according to the present invention.
Figure 6B:
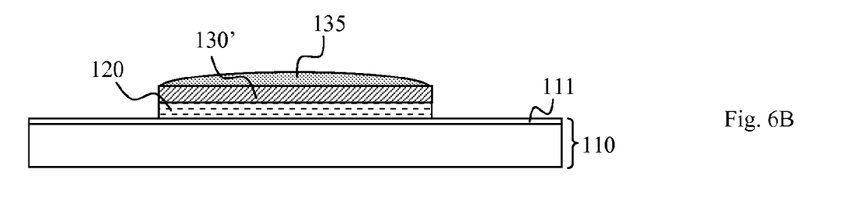
Figure 6C:
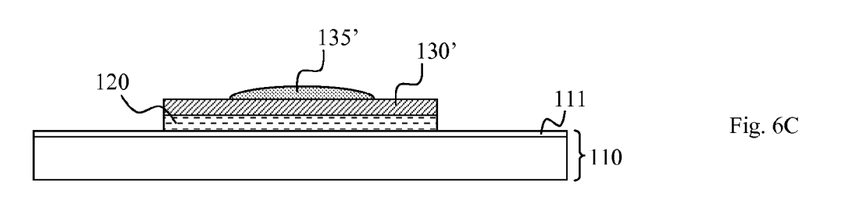
Figure 6D:
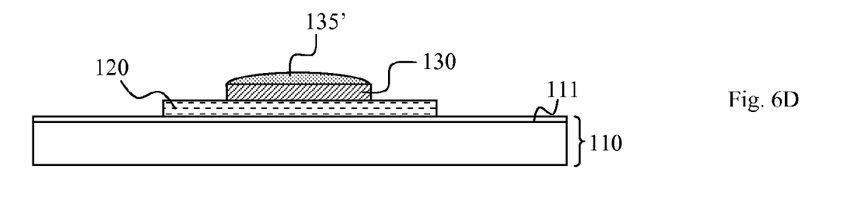

Hereafter, a process for forming a patterned etching stop structure of the present invention is illustrated. Referring to FIGS. 6A-6D, a patterned etching stop structure is formed on a crystalline semiconductor layer according to an exemplary method of the present invention. For example, but not limited to, the structures in FIGS. 4A and 5A go through the plasma enhanced chemical vapor deposition (PECVD) to deposit an etching stop layer 130' on the crystalline semiconductor layer 120 (as shown in FIG. 6A). Then, a photoresist layer 135 is formed on the etching stop layer 130' (as shown in FIG. 6B). Thereafter, the photoresist layer 135 is patterned and a portion of the etching stop layer 130' is exposed (as shown in FIG. 6C). Thereafter, the exposed portion of the etching stop layer 130' is removed to form the patterned etching stop layer 130 (as shown in FIG. 6D). Then, the patterned photoresist layer 135' is removed to form the structures as shown in FIGS. 4B and 5B. In this manner, the patterned etching stop structure 130 is formed on the crystalline semiconductor layer 120. Then, the manufacturing process of the transistor of the present invention is subsequently performed.

Although the present invention has been described in considerable detail with reference to certain embodiments thereof, other embodiments are possible. Therefore, their spirit and scope of the appended claims should no be limited to the description of the embodiments contained herein.

What is claimed is:

1. A manufacture method of a transistor, the method comprising:
   providing a substrate;
   forming a patterned crystalline semiconductor layer on the substrate;
   forming a patterned etching stop structure on the crystalline semiconductor layer;
   depositing an ohmic contact layer to overlie the crystalline semiconductor layer and the etching stop structure;
   respectively forming a first ohmic contact region on one side of the crystalline semiconductor layer and the etching stop structure, and a second ohmic contact region on the other side of the crystalline semiconductor layer and the etching stop structure; and
   respectively forming a source to overlie the first ohmic contact region and a drain to overlie the second ohmic contact region.

2. The method according to claim 1, further comprising:
   forming a gate insulating layer on the source, the drain and the crystalline semiconductor layer; and
   forming a gate on the gate insulating layer.

3. The method according to claim 1, wherein the step of forming the patterned etching stop structure on the crystalline semiconductor layer further comprises:
   depositing an etching stop layer on the crystalline semiconductor layer via plasma enhanced chemical vapor deposition (PECVD);
   forming a photoresist layer on the etching stop layer;
   patterning the photoresist layer and exposing a portion of the etching stop layer;
   removing the exposed portion of the etching stop layer to form the patterned etching stop structure; and
   removing the patterned photoresist layer.

4. The method according to claim 1, wherein the crystalline semiconductor layer comprises a polycrystalline silicon semiconductor layer.

5. The method according to claim 1, further comprising:
   removing an area of the etching stop layer exposed outside the first ohmic contact region and the second ohmic contact region.

6. The method according to claim 1, wherein the step of respectively forming the first ohmic contact region and the second ohmic contact region further comprises:
   patterning the ohmic contact layer and the crystalline semiconductor layer at the same time with the same mask.

7. The method according to claim 1, wherein the step of respectively forming the source and the drain further comprises:
   forming a source/drain layer to overlie the ohmic contact layer and the substrate; and
   patterning the ohmic contact layer and the source/drain layer at the same time with the same mask.

8. The method according to claim 1, wherein the step of depositing the ohmic contact layer to overlie the crystalline semiconductor layer and the etching stop structure further comprises depositing the ohmic contact layer to overlie a portion of the substrate.

9. The method according to claim 8, wherein the step of respectively forming the source and the drain further comprises:
   forming a source/drain layer to overlie the ohmic contact layer; and
   patterning the ohmic contact layer and the source/drain layer at the same time with the same mask.

* * * * *